April 27, 1954 B. R. GARDNER, JR 2,677,122

CONTROL CIRCUIT

Filed July 13, 1950

INVENTOR.
Benjamin R. Gardner, Jr.
BY
Harry M. Saragovitz
ATTORNEY

Patented Apr. 27, 1954

2,677,122

UNITED STATES PATENT OFFICE 2,677,122

CONTROL CIRCUIT

Benjamin R. Gardner, Jr., Ellwood City, Pa.

Application July 13, 1950, Serial No. 173,637

3 Claims. (Cl. 340—171)

Figure 1:
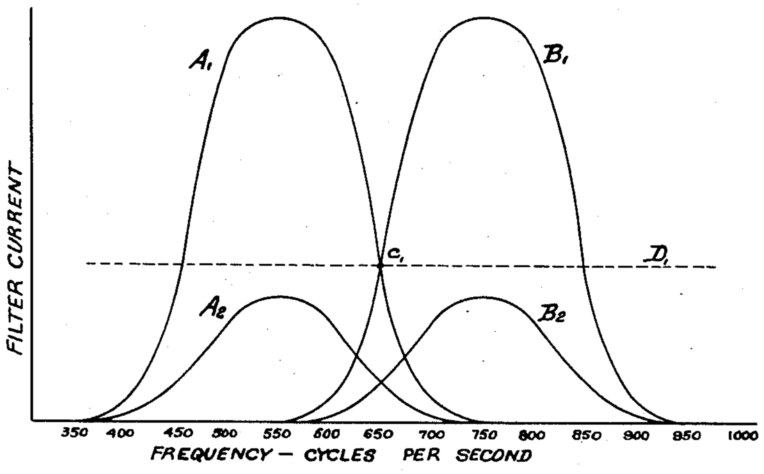

(Granted under Title 35, U. S. Code (1952), sec. 266)

This invention may be manufactured and used by or for the Government for governmental purposes without the payment to me of any royalty thereon.

This invention relates to a frequency-selective electrical system.

It is an object of this invention to provide an electrical system which is adapted to discriminate among a plurality of signals of different frequencies.

A further object of this invention is to control the selectivity of a plurality of electrical filter circuits in response to the amplitude of the input signals.

Further objects and advantages of my invention will become apparent from a consideration of the following description and drawings showing one form of my invention.

Figure 2:
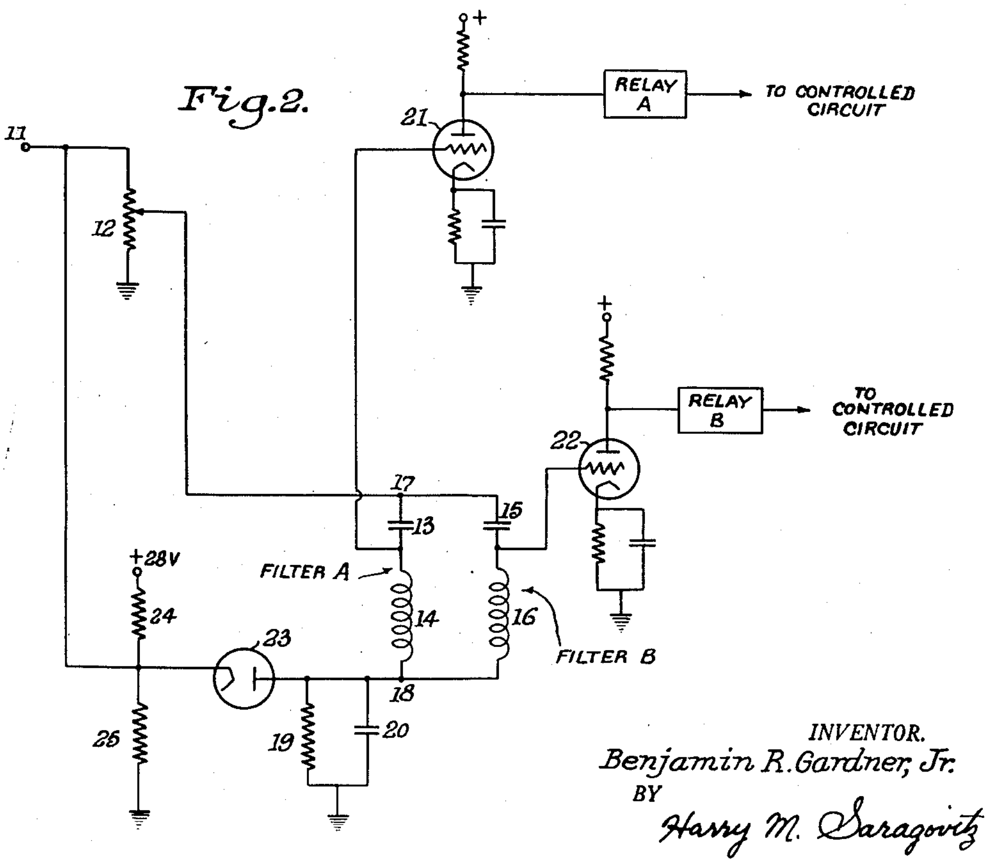

In the drawings:

Figure 1 illustrates the response curves of a pair of filters operating in a relatively narrow frequency band, and Figure 2 is a schematic view showing the basic elements of one form of my frequency-selective circuit.

In accordance with the illustrated form of my invention, a plurality of filter circuits are provided, each adapted to pass or reject an input signal, depending on the frequency thereof. Such circuits each include a filter and an output control element. A unilateral conducting device, such as a diode, is provided in parallel with the filter circuits and controls the selectivity of the filter circuits to the amplitude of the input signal. By this arrangement, only one filter circuit will respond to an input signal of a given frequency even though both filter circuits might normally pass the same signal in the absence of the means for controlling the filter circuit selectivity.

In Figure 1, curve $A_1$ represents the response of a filter A to different frequency input signals of a given amplitude. The ordinates may be considered as being proportional to the current through the filter. It will be seen that maximum current through filter A occurs when the input signal is at a frequency of 550 cycles per second. At signal frequencies above and below this value the filter presents a higher impedance path and hence the current flow is smaller as the departure from this center frequency is greater.

A similar curve $B_1$ is shown for filter B with the input signals of the same amplitude as in $A_1$. The frequency to which filter B is most responsive is 750 cycles per second. It will be seen from the response curves that there is a region between 550 cycles per second and 750 cycles per second for which both filters will pass current, so that both circuits controlled by the respective filters will be actuated.

In many instances it is a distinct disadvantage to have more than one filter pass a signal of a given frequency, and therefore it is necessary to eliminate the overlapping regions of the response curves. This could be done by providing a biasing means for the filter circuits such that the response curves $A_1$ and $B_1$ will be true only for the portions above the dashed line $D_1$ which passes through cross-over point $c_1$ (650 cycles per second). With reference to Figure 2, associated with filter A is a control tube 21. A fixed negative bias could be provided on the grid of tube 21 so that this tube would be non-conductive except for filter currents greater than $D_1$. Hence for the given signal amplitude the controlled circuit associated with filter A would be actuated only for such signals between the frequencies of 450 and 650 cycles per second. Also, by providing negative grid bias on a similar control tube 22, the circuit controlled by relay B would be actuated only for signals of the given amplitude between 650 and 850 cycles per second.

There is immediately apparent one disadvantage of a system employing a fixed bias on the control tubes 21, 22. With a fixed bias the operation is designed only for input signals of a given amplitude. If the input signals are of lower amplitude the response curves of the filters will be correspondingly lower, as represented by $A_2$ and $B_2$ in Figure 1. With the above-discussed fixed bias on tubes 21 and 22, it will be apparent that none of these lower amplitude signals at any frequency will be passed to either controlled circuit. Also, if the signals are of higher amplitude than that which results in response curves $A_1$ and $B_1$, there will be an overlapping portion of the response curves, so that both controlled circuits will be actutaed.

The inflexibility of a fixed bias control can be avoided by providing a variable bias control which is proportional to the amplitude of the input signal. Thus, for a small amplitude signal the bias on the control tubes would be lessened so that one controlled circuit would be actuated. For a signal of greater amplitude the control tube bias would be made more negative, but still only one controlled circuit would be actuated.

Operation of the selector system will be discussed with reference to Figure 2. The incoming signals at terminal 11 are fed to the filter circuits by way of potentiometer 12. A plurality of filters A (13, 14) and B (15, 16), one for each control circuit, are shown as each consisting of a series L-C combination. The filters are connected in parallel between points 17 and 18. A signal appearing across potentiometer 12 causes current to flow from point 17 to point 18, through filters A and B and thence through the parallel combination of resistor 19 and capacitor 20 to ground.

Assuming that filter A is closely tuned to the frequency of the incoming signal, a low impedance path is presented by this filter, resulting in high current flow through it. This high current would tend to cause a large voltage drop across inductance 14 of filter A. The control grid of relay control tube 21 would thereby be rendered more positive, and the resulting current flow through this tube would actuate relay A for controlling the load associated with it. Each relay control tube 21, 22 is normally biased substantially to cut-off, so that substantially no plate current flows in the absence of a positive voltage applied to the control grid. In those filters which are not tuned to the incoming signal, a high impedance path is presented to current flow therein. In the absence of high current flow the voltage drop across the inductance of such filter is low, and no positive voltage is applied to the control grid of the associated relay control tube sufficient to render it conductive for actuating the relay.

In practice, with a number of control signals whose frequency separation is rather close, it may be found that, in the absence of biasing means, a given signal would actuate more than one relay, as indicated in Figure 1. To increase the selectivity of the system by making each filter circuit less responsive to signals off its resonant frequency a varying bias is applied to each relay control tube responsive to the amplitude of the input signal. For a stronger signal the bias on each relay control tube is proportionately made more negative, so as to eliminate the overlapping portions of the filter response curves.

In Figure 2, normally (in the absence of a signal) no current flows through diode 23 since its cathode is maintained a few volts positive by means of voltage divider 24, 25 while the plate is at ground potential. If a large signal is applied to terminal 11, the cathode is driven negative with respect to ground during the negative half-cycle of the input signal. Tube 23 conducts, and therefore point 18 is rendered negative with respect to ground. Therefore, the control grid of relay control tube becomes more negative than it would be in the absence of conduction through bias tube 23. Signals of quite small amplitude do not drive the cathode of bias tube 22 negative with respect to ground, and therefore, since the bias tube does not conduct, no change in grid bias on the relay control tubes 21, 22 occurs.

It will be seen that the connection to voltage divider 24, 25 determines the initial positive potential on the cathode of bias tube 21, and thereby determines what amplitude of the input signal is needed to overcome this initial positive potential to render the bias tube conductive. In certain applications of this invention it may be desired to operate tube 23 with no initial positive cathode bias, so that it will be rendered conductive upon reception of even a very small input signal. With such an arrangement there is no delay in the operation of the bias tube caused by the requirement that the input signal build up to a sufficient amplitude to cause conduction through the tube.

While I have shown for purposes of illustration a diode as the dynamic biasing means for controlling the operation of the filter circuits, any suitable rectifier or unilateral conducting means may be substituted in place of the diode 23 within the scope of my invention.

It will be apparent from the foregoing explanation that, by virtue of the biasing means provided in conjunction with the basic relay circuit, for input signals which cause conduction through the biasing means the grid bias on the relay control tubes will be proportional to the amplitude of the input signal. For a larger input signal each control tube 21, 22 associated with a filter circuit will have a greater negative bias. Therefore, the working bias on tubes 21, 22 will vary with the input signal strength such that it will never fall below the cross-over voltage (which would permit operation of more than one relay at a time). For lower input signals, the bias on the control tubes will drop so that one relay will operate.

Since only a schematic diagram of one embodiment of my invention has been shown, it will be apparent that many modifications and additions can be made within the spirit of my invention. For example, various amplifiers and coupling arrangements may be provided in the input stages, depending upon the particular use of the circuit, without altering the essential operation of my invention, and it is intended to include within the purview of this invention all such changes. Further, it will be understood the invention is not limited to the frequency ranges discussed herein, which were merely cited for the purpose of explaining the operation of the system.

What is claimed is:

1. In a frequency selective system, an input terminal, a ground terminal, a plurality of filters connected in parallel to said input terminal and tuned to different frequencies, each filter comprising a capacitor and an inductance in series, with the free terminals of said capacitors connected to said input terminal, a plurality of control tubes, each including a cathode, anode and control grid, the control grid of each tube being connected to its respective filter at the junction between the capacitor and the inductance, a storage capacitor connected between the free terminals of said inductances and ground, and a unilateral conducting means, the anode terminal of said unilateral conducting means being connected to the common junction between said inductances and said storage capacitor, and the cathode terminal of said unilateral conducting device being electrically connected to said input terminal.

2. A system as in claim 1, wherein said cathode terminal is connected to a source of positive reference potential whereby said unilateral conducting means will not conduct until the amplitude of the alternating potential of the input terminal exceeds the value of the positive potential at the cathode terminal.

3. A system as in claim 2, wherein said source of positive reference potential is an adjustable tap on a voltage divider connected between a source of positive potential and ground.

References Cited in the file of this patent

UNITED STATES PATENTS

| Number | Name | Date |
|---|---|---|
| 1,956,397 | Nicolson | Apr. 24, 1934 |
| 2,020,813 | Van Slooten | Nov. 12, 1935 |
| 2,113,395 | Braden | Apr. 5, 1938 |
| 2,122,193 | Bedford | June 28, 1938 |
| 2,141,426 | Weathers | Dec. 27, 1938 |
| 2,173,154 | Bernard | Sept. 19, 1939 |
| 2,192,959 | Ballard | Mar. 12, 1940 |
| 2,243,141 | Waegant | May 27, 1941 |
| 2,250,100 | Hubbard | July 22, 1941 |
| 2,273,639 | Haantjes | Feb. 17, 1942 |
| 2,361,602 | Clark | Oct. 31, 1944 |
| 2,370,403 | Hecht | Feb. 27, 1945 |